METHOD OF ACCURATELY MACHINING SEMICONDUCTOR BODIES

Filed May 13, 1960

INVENTOR
WALLACE E. RICHMOND
BY
Elmer J. Nealon
ATTORNEY

United States Patent Office 3,097,458

Patented July 16, 1963

3,097,458

METHOD OF ACCURATELY MACHINING SEMICONDUCTOR BODIES

Wallace E. Richmond, Hillsboro, N.H., assignor to Sylvania Electric Products Inc., a corporation of Delaware Filed May 13, 1960, Ser. No. 28,924
5 Claims. (Cl. 51—281)

Figure 1:
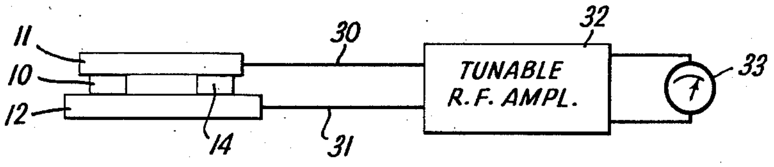

This invention relates to a method for mechanically reducing the size of bodies, and more particularly to a method for mechanically reducing the thickness of wafers of semiconductor material which provides for determination of the thickness during the reducing operation.

In the manufacture of semiconductor electrical translating devices, such as diodes and transistors of well known types, the active semiconductor crystal elements employed therein must generally be in the form of small thin pieces or chips commonly known as dice. These dice are produced from blocks or ingots which result from the steps involved in purification, controlled addition of doping impurities, and formation of the initial semiconductor material into a single crystal structure. It is common practice to divide an ingot of appropriately prepared semiconductor material into slabs or wafers by repeatedly cutting through the ingot parallel to one face of the ingot. These slabs are subsequently reduced in thickness and subdivided into dice of suitable lateral dimensions.

Semiconductor materials, such as germanium and silicon, which are commonly employed in semiconductor devices, are extremely hard and brittle. Because of these physical characteristics it is necessary to cut the slabs or wafers from the ingot much thicker than the final thickness of dice desired. The wafers are generally ground or lapped to reduce their thickness and to insure flatness and uniformity of thickness throughout the wafer. Each wafer is then divided into dice as by the well known technique of scribing grooves in one surface of the wafer and breaking up the wafer along the grooves. The resulting dice are then chemically etched to reduce the dice to the thickness desired in the final devices and to remove the mechanically worked surface layers.

The process of grinding or lapping the wafers cut from an ingot is commonly carried out employing standard commercially available equipment and known lapping techniques. Mechanically removing material from the wafers in this manner is relatively inexpensive as compared to removing material by chemical etching procedures. However, care must be taken so that an excessive amount of material is not removed by lapping. If wafers are lapped too thin, the stresses introduced by the lapping operation itself may cause the wafers to shatter. In addition, the handling of extremely thin wafers during the steps of scribing and breaking up may cause excessive breakage along other than the scribed lines. Reduction of wafers to an optimum thickness by lapping thus provides the most efficient removal of material while permitting the wafers to be scribed and broken into dice with a minimum of loss because of fractured or malformed dice. Most commonly the thickness of wafers being lapped is checked periodically during the lapping operation by interrupting the operation in order to remove wafers from the equipment and measure them. If the rate at which the lapping equipment removes material from a wafer is known, the period of lapping required to obtain a desired thickness can be calculated from the thickness of the unlapped wafers. However, because of variations in the many factors affecting the rate of lapping, this elapsed time technique cannot be completely relied on and the lapping operation must be interrupted and actual measurements of the wafers taken.

Therefore, it is an object of the present invention to provide a method for determining the magnitude of a dimension of a body of semiconductor material while the magnitude of that dimension is being reduced.

It is another object of the invention to provide a method for precisely and efficiently reducing wafers of semiconductor material to a predetermined thickness.

Briefly, in accordance with the objects of the invention a body of semiconductor material and a body of piezoelectric material are subjected to a machining operation reducing the magnitude of corresponding dimensions of the bodies. In accordance with the well known phenomenon of piezoelectricity, deformation of the body of piezoelectric material resulting from mechanical vibrations during the machining operation causes alternating electrical currents to be generated in that body. The body of piezoelectric material has a natural resonant frequency of mechanical vibration thereby producing the strongest electrical currents at the same frequency. The frequency of resonance is dependent on the magnitude of particular dimensions of the body. The body of piezoelectric material employed is such that its natural resonant frequency will vary predictably as the magnitude of the dimensions being reduced is changed. Thus, as the bodies of semiconductor and piezoelectric material are reduced by the machining operation, the frequency of the piezoelectric currents produced in the body of piezoelectric material is measured in order to determine the thickness of the bodies.

Figure 2:
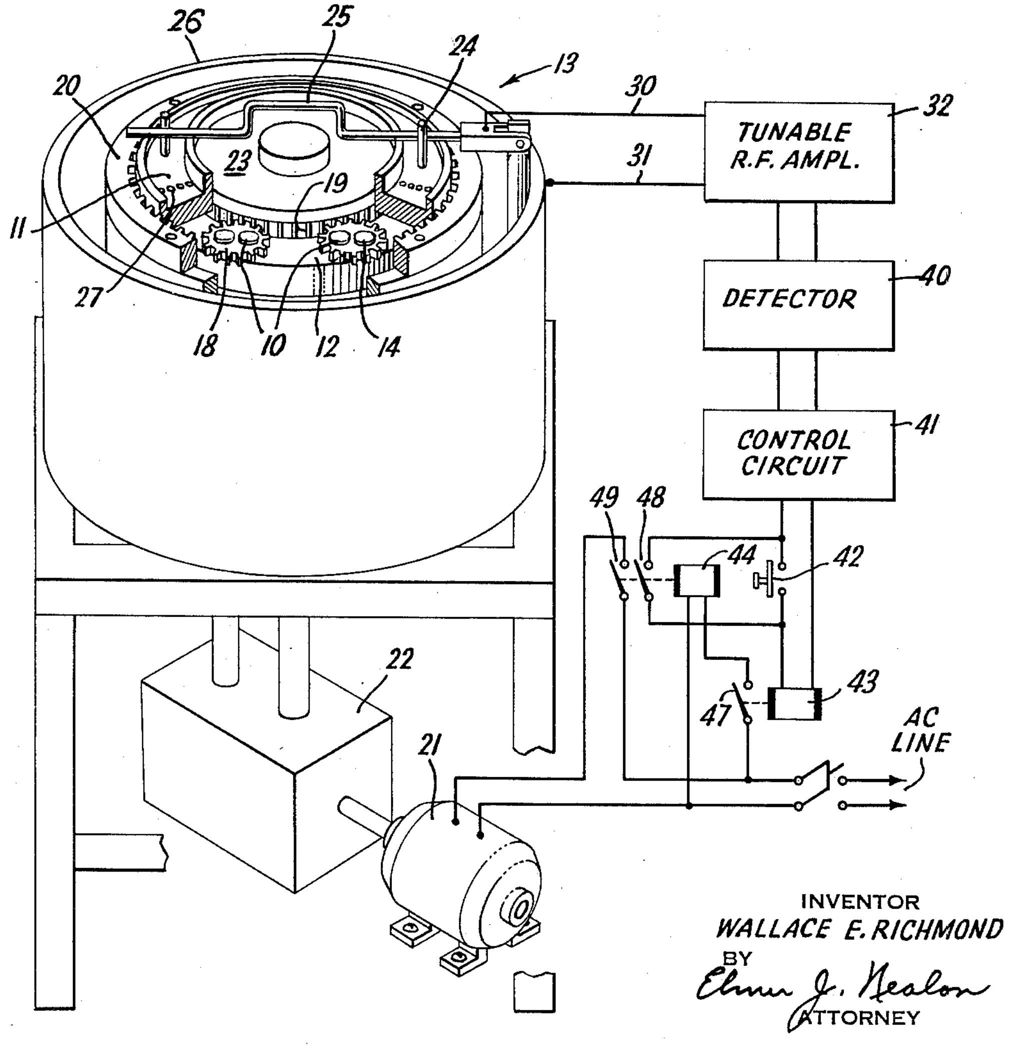

The details of the method of the invention together with other objects, features, and advantages thereof will be apparent from the following detailed discussion and the accompanying drawings wherein:

FIG. 1 is a schematic diagram representing apparatus for lapping a body of semiconductor material together with a body of piezoelectric material, and an RF amplifier for determining the frequency of piezoelectric currents produced by the piezoelectric body;

FIG. 2 includes a perspective view of a planetary type of lapping equipment employed in lapping bodies of semiconductor and piezoelectric material shown with portions removed, and in block diagram form, circuitry which is employed to stop the lapping operation when the bodies have been reduced to a predetermined thickness.

As shown in the diagram of FIG. 1 and in the perspective view of FIG. 2, wafers of semiconductor material 10 are placed between the upper and lower lapping members 11 and 12 of the lapping equipment 13. Bodies or blanks of a piezoelectric material 14 are also placed between the lapping members. The lapping equipment of the planetary type as best shown in FIG. 2 includes carriers 18 having openings therethrough into which the wafers and blanks are placed. The carriers are of insulating material and are thinner than the final thickness to be attained by the bodies. Teeth on the outer edges of the carriers mesh with the teeth in an inner gear 19 and the teeth in an outer ring gear 20. The two gears are rotated in the same direction (counterclockwise as shown in FIG. 2) but at different rates of angular rotation in order to move the carriers through a circular path about the central axis of the gears and at the same time revolve each carrier about its own axis in planetary fashion. An electric motor 21 drives the two gears through a suitable mechanism 22 in order to obtain the desired angular speeds. The two lapping members 11 and 12 are stationary, and movement of the bodies between them provides the abrasive action. The upper lapping member, which is removable to permit loading and unloading of the bodies, is centered out of contact with the gears by a disc of insulating material 23 around the hub of the equipment. It is prevented from rotating by lugs 24 bearing against a restraining rod 25 attached to the frame 26 of the equipment but electrically insulated therefrom. Abrasive material is applied between the bodies being lapped and the lapping members through openings 27 in the upper lapping member 11. The upper lapping member is electrically connected to a lead 30 attached to the restraining rod, and the lower lapping member is electrically connected to another lead 31 attached directly to the frame 26. The leads are connected to the input terminals of a tunable radio frequency amplifier 32. These connections are shown schematically in FIG. 1.

In carrying out the method of the invention, semiconductor wafers are placed in the majority of the openings in the carriers 18. Three or four blanks of piezoelectric material of approximately the same thickness as the wafers are placed in carriers at openings spaced around the lower lapping member. The upper lapping member is set in place, a prepared abrasive material introduced through the openings 27 in the upper lapping member, and the drive motor 21 energized. Material is gradually removed from the wafers and blanks by the action of the abrasive material and the lapping members on the surfaces of the bodies. Mechanical vibrations caused by the relative movement between the piezoelectric blanks and the lapping members apply stresses to and deform the piezoelectric blanks. In accordance with known piezoelectric effects, alternating currents are produced at the faces of the blanks and these are conducted by the lapping members and the leads 30 and 31 to the RF amplifier 32. Because of their relatively high resistivity, the semiconductor wafers do not affect the electrical currents produced. Employing the apparatus shown schematically in FIG. 1, the resonant frequency of the currents being produced is measured by tuning the RF amplifier to the frequency which produces a maximum reading of current in an ammeter 33 placed in the amplifier output circuit. Since the thickness of the blanks of piezoelectric material determine the frequency of resonance and since all of the bodies of semiconductor and piezoelectric material are being ground simultaneously and are substantially equal in thickness, the thickness of the bodies being lapped may be checked continually or at any time while the operation is being carried out. Thus, the process may be stopped when the frequency reading indicates that the thickness of the piezoelectric blanks corresponding to the desired thickness of the semiconductor wafers has been reached.

FIG. 2 includes a block diagram of electrical control apparatus for measuring the frequency of signals from the piezoelectric blanks and for turning off the drive motor of the lapping equipment when the generated resonant frequency of the blanks indicates that the bodies have reached a predetermined thickness. The output of the RF amplifier 32 is connected to a detector 40, and the detected signal is applied to a suitable electrical control circuit 41. The control circuit operates to supply current above a minimum level to its output circuit so long as the amplitude of the signal from the detector is below that which is obtained when the resonant frequency of the piezoelectric blanks reaches the frequency to which the RF amplifier is tuned. This effect can be obtained by employing the detected signal to bias a vacuum tube so that the current in the anode circuit of the tube constitutes the output from the control circuit. As the bias is increased negatively the flow of output current is reduced.

The other items of electrical equipment shown in FIG. 2 including the push button switch 42 and the relays 43 and 44 and their functions in conjunction with the circuitry shown in block diagram form can best be understood from a discussion of the operation of all the apparatus shown in FIG. 2. Wafers of semiconductor material 10 and three or four blanks of piezoelectric material 14 are placed in carriers 18 between the lapping members 11 and 12. The RF amplifier is tuned to the frequency at which a body of the piezoelectric material of thickness equal to the desired thickness of the semiconductor wafers will resonate. The output circuit of the control circuit 41 is completed by closing the push button switch 42. Since no detected signal is being applied at the input of the control circuit, current flows through its output circuit including the armature of a single pole D.C. relay 43. The contacts 47 of the D.C. relay close permitting A.C. current to flow through the armature of a double pole A.C. relay 44 and thus close both sets of contacts 48 and 49 in that relay. The first set of contacts 48 permits output current from the control circuit through the armature of the D.C. relay to be maintained after the push button 42 is released. The second set of contacts 49 closes the circuit between the lapping equipment drive motor 21 and the A.C. power line.

When the bodies between the lapping members have been reduced to the desired thickness, the natural resonant frequency of the piezoelectric blanks is the same as that to which the RF amplifier has been tuned. Piezoelectric currents of that frequency generated by the mechanical stresses of the lapping operation on the piezoelectric blanks are amplified by the amplifier 32 and detected by the detector 40. The amplified and detected signals are then applied to the control circuit 41 which reduces the flow of current in the armature of the D.C. relay 43 below that necessary to hold the contacts closed. The contacts of the relay are thus opened and current flow through the armature of the A.C. relay 44 is also stopped, permitting both sets of contacts 48 and 49 to open. After the first set of contacts 48 has been opened, the output circuit of the control circuit remains open regardless of subsequent signals from the amplifier and detector. When the second set of contacts 49 are opened, the lapping equipment drive motor 21 is stopped, thus interrupting the lapping operation with the bodies at the desired predetermined thickness.

The method as disclosed has been employed for lapping wafers of semiconductive germanium having an original thickness of from 10 to 15 mils to a desired thickness of 6 mils. This has been done repeatedly in a single operation and wafers have been obtained which are within a fraction of a mil of the desired thickness. Quartz crystal blanks of an AT-cut have been employed as the blanks of piezoelectric material. The resonant frequency of these blanks is dependent upon their thickness. As can be readily understood from the foregoing detailed discussion the method of the invention provides for reducing the thickness of semiconductor wafers in a single operation, without interruption, while permitting the desired thickness to be readily obtained for each batch of wafers processed.

What is claimed is:

1. The method of determining the magnitude of a dimension of a body of semiconductor material undergoing a machining operation which comprises the steps of subjecting a body of semiconductor material and a body of piezoelectric material having a correspondingly oriented dimension the magnitude of which determines its resonant frequency to a machining operation simultaneously reducing the corresponding dimension of each of said bodies at the same rate, and measuring during the machining operation the frequency of the piezoelectric currents produced in said body of piezoelectric material by the stresses caused by the machining operation.

2. The process of manufacturing crystal elements of semiconductor material which includes the steps of mechanically removing material simultaneously and at the same rate from a body of semiconductor material and a body of piezoelectric material, determining the resonant frequency of the body of piezoelectric material by measuring the frequency of the piezoelectric currents generated by the removal of material, and interrupting the removal of material when the frequency of said currents reaches a predetermined value.

3. The method of manufacturing crystal elements of semiconductor material which includes the steps of simultaneously reducing the magnitude of a dimension of a body of semiconductor material and the magnitude of a corresponding dimension of a body of piezoelectric material the resonant frequency of which is determined by the magnitude of said dimension, measuring the resonant frequency of the body of piezoelectric material during the reducing operation, and stopping the reducing operation when the resonant frequency of the body of piezoelectric material attains a predetermined value indicating a predetermined magnitude of said dimensions of the body of piezoelectric material and the body of semiconductor material.

4. The method of manufacturing crystal elements of semiconductor material which comprises the steps of simultaneously reducing the magnitude of a dimension of a body of semiconductor material and the magnitude of a corresponding dimension of a body of piezoelectric material by mechanical means, measuring the frequency of the piezoelectric currents generated by the body of piezoelectric material during the reducing operation, and interrupting the reducing operation when the frequency of the piezoelectric currents become substantially equal to a predetermined frequency indicating a predetermined desired magnitude of said dimension of the body of piezoelectric material and the body of semiconductor material.

5. The method of controlling the reduction of the magnitude of a dimension of a body of semiconductor material to a predetermined magnitude including the steps of placing a body of semiconductor material and a body of piezoelectric material in an apparatus for mechanically removing material therefrom so as to reduce the magnitude of a dimension of said body of semiconductor material and the magnitude of a corresponding dimension of the body of piezoelectric material, the magnitude of said dimension of the body of piezoelectric material determining the resonant frequency of said body, operating said apparatus to remove material from said bodies while maintaining the magnitude of said dimensions of said bodies equal to each other, measuring the frequency of the piezoelectric currents generated by and during operation of said apparatus, and interrupting the operation of said apparatus when the resonant frequency of said piezoelectric currents is equal to the resonant frequency of a body of said piezoelectric material having a dimension of magnitude equal to said predetermined magnitude.

References Cited in the file of this patent

UNITED STATES PATENTS

| | | |
|---|---|---|
| 2,539,561 | Wolfskill | Jan. 30, 1951 |
| 2,562,917 | Hoyt | Aug. 7, 1951 |
| 2,970,411 | Trolander | Feb. 7, 1961 |